United States Patent
Goh et al.

(10) Patent No.: US 6,548,231 B1
(45) Date of Patent: Apr. 15, 2003

(54) ENHANCED PASSIVATION SCHEME FOR POST METAL ETCH CLEAN PROCESS

(75) Inventors: Aik Hon Goh, Singapore (SG); Xin Zhang, Singapore (SG); Carol Goh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 74 days.

(21) Appl. No.: 09/709,601

(22) Filed: Nov. 13, 2000

(51) Int. Cl.[7] .................................................. G03C 5/56
(52) U.S. Cl. ...................... 430/329; 430/328; 430/311; 430/322; 430/318; 134/1.1; 134/1.2
(58) Field of Search ................................. 430/329, 328, 430/311, 322, 318; 134/1.1, 1.2

(56) References Cited

U.S. PATENT DOCUMENTS

| | | | |
|---|---|---|---|
| 5,545,289 A | 8/1996 | Chen et al. | 156/643.1 |
| 5,814,155 A | 9/1998 | Solis et al. | 134/1 |
| 5,925,501 A | * 7/1999 | Zhang et al. | 134/1.2 |
| 5,980,770 A | 11/1999 | Ramachandran et al. | 216/67 |
| 6,080,680 A | 6/2000 | Lee et al. | 438/727 |
| 6,271,115 B1 | * 8/2001 | Liu et al. | 430/330 |

* cited by examiner

Primary Examiner—Mark F. Huff
Assistant Examiner—Daborah Chacko-Davis
(74) Attorney, Agent, or Firm—George O. Saile; Rosemary L. S. Pike

(57) ABSTRACT

A two step passivation procedure, used to remove chlorine from polymer layers formed on the sides of metal structures, prior to removal of the defining photoresist shape, and of the polymer layers, has been developed. The procedure features a first passivation step, performed at a low substrate temperature, (100–140° C.) at low RF power, (150 to 250 watts), and using a 2 to 1 ratio of oxygen to water, resulting in removal of corrosion causing chlorine, from the polymer layers, located on the sides of a first group of defined metal structures, which in turn reside at the edge of a semiconductor substrate. A second passivation step, of the two step passivation procedure, is then performed using water only, at higher substrate temperature, (200–250° C.), resulting in removal of chlorine from polymer layers located on the sides of a second set of metal structures, which reside at the center of the semiconductor substrate. Removal of the masking photoresist shape, and removal of the polymer layers, now without chlorine, is then performed.

21 Claims, 2 Drawing Sheets

ENHANCED PASSIVATION SCHEME FOR POST METAL ETCH CLEAN PROCESS

BACKGROUND OF THE INVENTION (1) Field of the Invention

The present invention relates to methods used to fabricate semiconductor devices, and more specifically to a method used to remove masking photoresist shapes, and polymer layers formed during dry etch definition of metal structures.

(2) Description of Prior Art

Micro-miniaturization, or the ability to fabricate semiconductor structures comprised with sub-micron features, have resulted in performance enhancements for semiconductor devices. The attainment of devices with sub-micron features has been realized via advancements in several semiconductor fabrication disciplines, such as photolithography and dry etching. The development of more sophisticated exposure cameras, and of more advanced photosensitive materials have allowed sub-micron features to be routinely formed in masking photoresist layers. In addition the continuing evolvement of dry etching tools and processes, have allowed the sub-micron images in photoresist layers to be easily transferred to underlying materials, such as metal or insulator layers, used to build the desired semiconductor device. However to successfully define sub-micron features in a material such as a metal layer, the dry etching reactants have to possess high selectivity between the masking photoresist shape and the metal layer, as well as high selectivity between the metal being defined, and the underlying material, allowing controllable dry etch end point to be achieved, The desired selectivity is usually obtained via use of a dry etch ambient which forms a non-etchable polymer type layer at the dry etching end point, allowing protection of materials underlying the now defined metal shape to be achieved. The polymer layer also forms on the exposed sides of the defined metal shape, protecting the metal shape from any isotropic component of the dry etch procedure. The polymer layer, comprised of halogens from the dry etching reactants, such as chlorine, is removed during the process used to remove the masking photoresist shapes. However if the photoresist removal process is not optimized, chlorine emanating from the polymer layer can attack, and corrode the exposed surfaces of the defined metal shape, resulting in yield and reliability loss.

This invention will teach a two step procedure for successfully removing the masking photoresist shape, as well as the chlorine containing polymer layer, in which process conditions of a first step of the two step procedure, such as RF power, substrate temperature, and reactant ratio, are optimized to allow removal of the corrosion causing chlorine feature from the polymer layer to be achieved. Prior art, such as Ramachandran et al, in U.S. Pat. No. 5,980,770, as well as Lee et al, in U.S. Pat. No. 6,080,680, describe methods for removing photoresist shapes as well as polymer layers, however those prior-arts do not employ the unique two step removal procedure, featuring the unique set of process conditions of the first step of the procedure, that are described in this present invention.

SUMMARY OF THE INVENTION

It is an object of this invention to use a two step passivation, and strip procedure to remove masking photoresist shapes and polymer layers, formed on defined metal structures at the conclusion of a metal defining, dry etch procedure.

It is another object of this invention to employ a first step, of the two step passivation strip procedure that features a lower substrate temperature, a lower RF power, and an increased ratio of oxygen to water, when compared to the second step of the two step passivation procedure, to optimize the removal of the corrosive chlorine from the polymer layer, located at the wafer edge, during this initial stage of the removal of masking photoresist shapes and polymer layers.

It is yet another object of this invention to employ a higher substrate temperature, and a higher RF power, when compared to the first step of the two step passivation procedure, to remove chlorine from the polymer layer, located at the center of the wafer, using only water as a reactants.

It is still yet another object of this invention, after the two step passivation procedure, removing chlorine from the edges, and center, of a wafer, to strip the masking photoresist shape, followed by a clean procedure used to remove the polymer from the sides of the defined metal structure.

In accordance with the present invention a two step passivation procedure, used to remove chlorine from a polymer layer formed on the sides of a dry etched, metal structure, prior to removal of the masking photoresist shape and polymer layer, is described. A dry etching procedure, featuring a chlorine containing etchant, is used to define a metal shape, using an overlying photoresist shape as an etch mask. A first step of the two step passivation procedure is next employed, at specific conditions, to remove chlorine from the polymer layer, formed on the sides of the defined metal shape, in regions near the edge of the wafer of semiconductor substrate. The removal of corrosive chlorine, at the wafer edge, which can attack the defined metal structure, is removed using an increased oxygen—water ratio, and a lower substrate temperature, and a lower RF power, when compared to conditions used in the second step. The second step of the two step procedure is next performed in water only, at a higher substrate temperature, and at a higher RF power to remove corrosive chlorine from polymer residing on the sides of the defined metal shapes, located at the center of the wafer. A strip procedure is then employed to remove the masking photoresist shape, followed by a cleaning step used to remove polymer layer from the sides of the defined metal shape.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
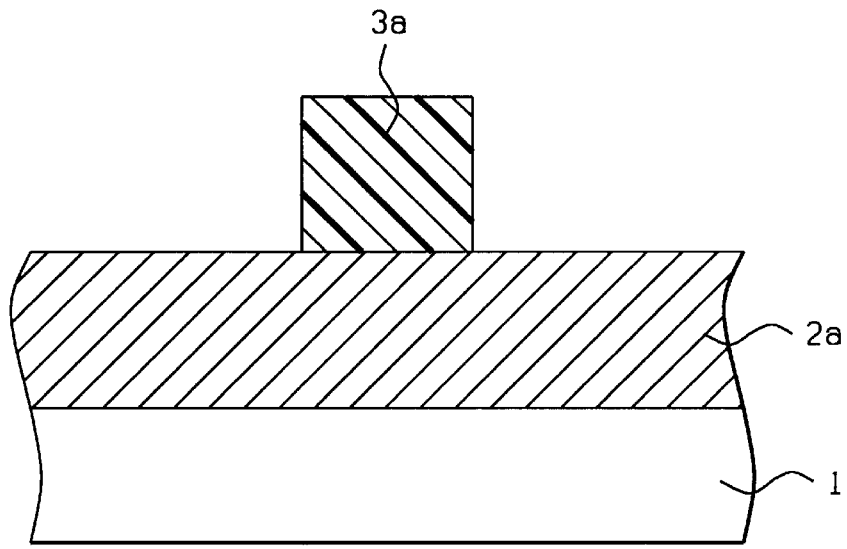
FIGS. 1–5, which schematically, in cross-sectional style, describe key stages of a two step passivation, and strip procedure, used to remove masking photoresist shapes, and chorine containing polymer layers, formed on the sides of defined metal structures, at the conclusion of the dry etch procedure used to define metal structures.

The method of removing a masking photoresist shape, and chlorine containing polymer layers, located on the sides of dry etched, defined metal structures, will now be described in detail. FIG. 1, schematically shows a metal layer 2a, such as aluminum, aluminum-copper, aluminum copper-silicon, or tungsten, on an underlying insulator layer 1, such as silicon oxide, or borophosphosilicate glass, (BPSG). Metal layer 2a, at a thickness between about 5000 to 8000 Angstroms, can be used for either lower level metal, or upper level interconnect structure, communicating with either active device regions in a semiconductor substrate, or underlying metal interconnect structures, via openings in insulator 1, exposing these underlying conductive regions. The openings in insulator 1, to underlying conductive regions are not shown in the drawings. Photoresist shape 3a, at a thickness between about 16000 to 18000 Angstroms, and with a width between about 4000 to 10000 Angstroms, is next formed on metal layer 2a, to be used as an etch mask for definition of a metal structure. This is schematically shown in FIG. 1.

Figure 2:
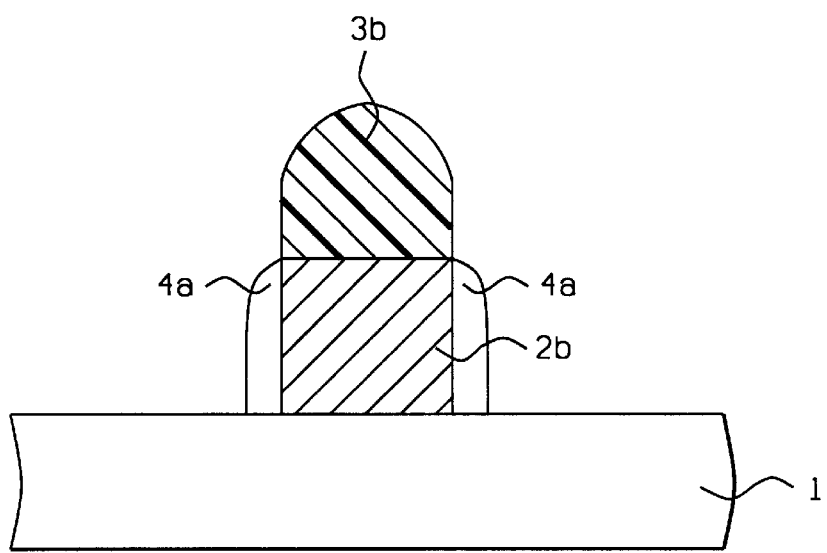

Definition of metal structure 2b, is next accomplished via an anisotropic, reactive ion etching (RIE), procedure, using a halogen containing etchant, such as chlorine or, chlorine and $BCl_3$ as a reactant, applied to metal layer 2a, using photoresist shape 3a, as an etch mask. During the RIE procedure-polymer layer 4a, comprised of carbon from photoresist shape 3a, and chlorine from the RIE procedure, forms on the sides of defined metal shape 2b. The formation of polymer layer 4a, exhibiting a low removal rate in RIE ambient, behaves as an etch stop, preventing unwanted lateral etching of metal structure 2b. The result of this procedure is schematically shown in FIG. 2.

Figure 3:
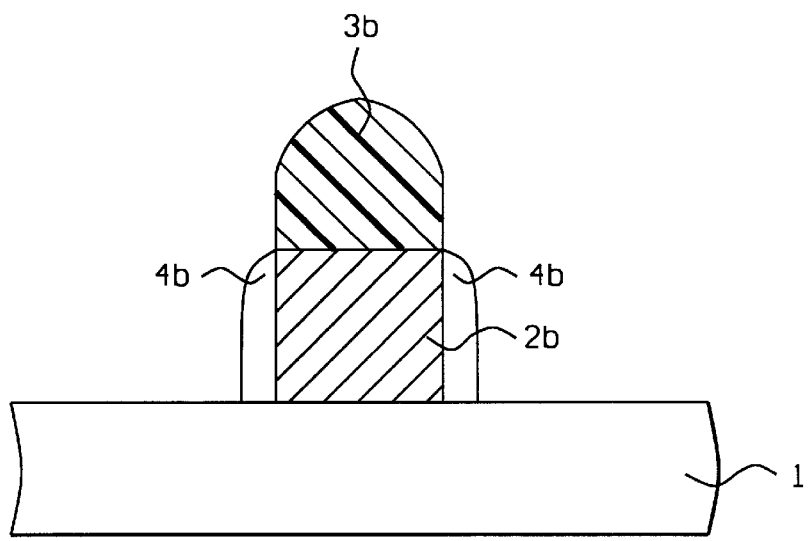

Removal of chlorine from polymer layers 4a, is next addressed and schematically shown in FIG. 3. The removal of these organic layers feature the use of oxygen and water, with the oxygen supplying the combustion properties needed to volatilize the photoresist and polymer layers, and water needed for removal of the chlorine incorporated in the polymer layers. If the chlorine is not efficiently removed corrosion of metal structure 2b, again comprised of either aluminum, or tungsten, can occur resulting in subsequent decreased device yield and reliability failures. To accomplish these objectives, removal of photoresist shape 3a, and polymer layers 4a, a post-metal etch, two step passivation is first used. The first step of this two step procedure, performed in an RF plasma tool, features: a low substrate temperature; a low RF power; and a high oxygen to water ratio. A major objective of the first step is chlorine removal from polymer layers 4a, in regions in which polymer layer 4a, resided on metal structure which in turn are located near the edge of the wafer or semiconductor substrate, therefore a low substrate temperature between 100 to 140° C., is chosen. This temperature will reduce the collisions of energized water particles, when compared to substrate temperatures greater than 200° C., thus allowing a larger number of energized water particles available to remove the corrosive chlorine species from the polymer layer. A low RF power, between about 150 to 250 watts, will again reduce energized water collisions, again allowing more energized water particles to be available for chlorine removal, when compared to passivation-strip procedures, featuring higher RF power conditions, such as 700 watts. In addition to water, the removal ambient also contains oxygen, the species needed for combustion or volatization of the organic materials. The use of a lower substrate temperature, in addition to the lower boiling point of oxygen, when compared to water, results in a greater degree of oxygen collisions, when compared to water collisions, therefore to enhance the combustion aspect of the first step procedure, a ratio between about 750 to 850 sccm of oxygen, to between about 350 to 450 sccm of water is used. These conditions, performed for between about 15 to 25 sec, at a pressure between about 4000 to 6000 mTorr, result in the structure schematically shown in FIG. 3, where polymer layer 4b, with a reduced level of chlorine, resulting from the energized water component, and oxygen component used in the first step of the two step, passivation procedure, is shown. However the first step of the passivation procedure mainly influences chlorine removal from the polymer layer, in regions near the wafer edge. To more effectively remove chlorine from polymer residing on defined metal structures located in the center of the wafer or semiconductor substrate, a second step of the two step passivation procedure is needed.

The second step of the two step passivation procedure, used to remove chlorine from polymer located on the sides of defined metal structure that in turn reside in the center of the wafer is next addressed. The conditions used for the second step, of the two step passivation procedure are: a substrate temperature between about 200–250° C., an RF power between about 600 to 800 watts, and a water input between about 450 to 550 sccm. The use of the higher substrate temperature and higher RF power allow a water only ambient to be used to complete the chlorine removal procedure, at the center of the wafer. The second step of this procedure is performed for a time between about 25 to 35 sec., at a pressure between about 800 to 1000 mTorr. FIG. 3, again schematically shows a polymer layer 4b, located on the sides of metal structure 2b, where the metal structures reside near the center of the wafer.

Figure 4:
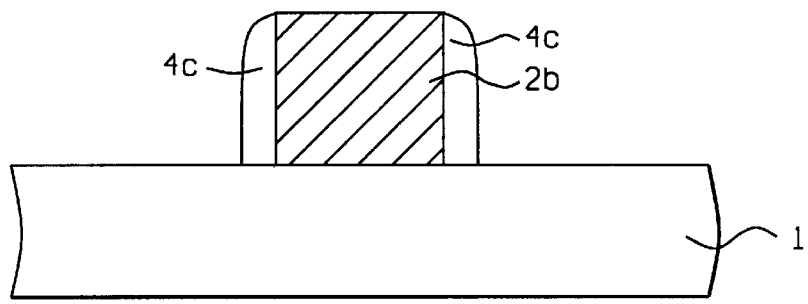
Figure 5:
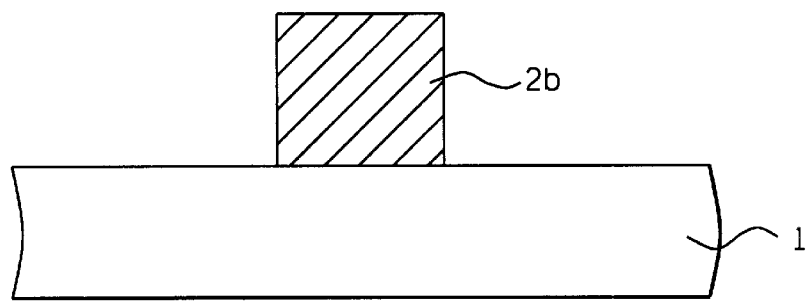

At this stage, with chlorine removed from polymer in all locations of the wafer, a strip procedure is employed-to remove photoresist shape 3b, and to partially remove polymer 4b. This is accomplished via plasma oxygen ashing, resulting in complete photoresist removal, in addition to partial removal of polymer layer 4b, resulting in polymer layer 4c, still remaining on the sides of metal structure 2b. This is schematically shown in FIG. 4. Finally a wet chemical clean, performed in a liquid solvent, is used to remove polymer layer 4c, from the sides of metal structure 2b, resulting in defined metal structure 2b, schematically shown in FIG. 5.

While this invention has been particularly shown and described with reference to, the preferred embodiments thereof, it will be understood by those skilled in the art that various changes in form and details may be made without departing from the spirit and scope of this invention.

What is claimed is:

1. A method of removing a masking photoresist shape from the top surface of a defined metal structure, and removing polymer layers formed on the sides of the defined metal structure, on semiconductor substrate, comprising the steps of:

providing metal structures, each with an overlying defining photoresist shape, and each with polymer layers comprised with incorporated chlorine, located on the sides of each metal structure;

performing a first step of a two step passivation procedure at a first temperature, a temperature of 140° C. or less, in a oxygen-water ambient, with said first step of said two step procedure removing chlorine from said polymer layers located on the sides of a first group of metal structures, wherein said first group of metal structures are located near an edge of said semiconductor substrate, and wherein said first step of said two step passivation procedure does not completely remove chlorine from said polymer layers located on the sides of a second group of metal structures, wherein said second group of metal structures are located near a center of said semiconductor substrate, performing a second step of said two step passivation procedure at a second temperature, with said second temperature higher than said first temperature, in a water only ambient, to remove remaining chlorine from said polymer layers located on the sides of said second group of metal structures;

removing said defining photoresist shape; and removing said polymer layers from the sides of said first group, and from the sides of said second group, of said metal structures.

2. The method of claim 1, wherein said metal structure, at a thickness between about 5000 to 8000 Angstroms, is formed from a metal layer such as aluminum, aluminum-copper, aluminum-copper-silicon, or tungsten.

3. The method of claim 1, wherein said metal structure is defined via an anisotropic RIE procedure using chlorine, or chlorine and $BCl_3$ as an etchant.

4. The method of claim 1, wherein said defining photoresist shape is comprised with a width between about 4000 to 10000 Angstroms, and at a thickness between about 16000 to 18000 Angstroms.

5. The method of claim 1, wherein said polymer layers are comprised with carbon and chlorine.

6. The method of claim 1, wherein said first step of said two step passivation procedure is performed in an RF plasma tool, at an RF power between about 150 to 250 watts, and with said semiconductor substrate at said first temperature between about 100 to 140° C.

7. The method of claim 1, wherein said first step of said two step passivation procedure is performed using oxygen at a flow between about 750–850 sccm, and water at a flow between about 350 to 450 sccm.

8. The method of claim 1, wherein said first step of said two step passivation procedure is performed for a time between about 15 to 25 sec, at a pressure between about 4000 to 6000 mTorr.

9. The method of claim 1, wherein said second step of said two step passivation procedure is performed in an RF plasma tool, at an RF power between about 600 to 800 watts, and with said semiconductor substrate at said second temperature between about 200 to 250° C.

10. The method of claim 1, wherein said second step of said two step passivation procedure is performed using water only, at a flow between about 450–550 sccm.

11. The method of claim 1, wherein said second step of said two step passivation procedure is performed for a time between about 25 to 35 sec, at a pressure between about 800 to 1000 mTorr.

12. The method of claim 1, wherein said second passivation step, of said two step passivation procedure is performed for a time between about 25 to 35 sec, at a pressure between about 800 to 1000 mTorr.

13. A method of removing a masking photoresist shape from a top surface of defined metal structures, and removing chlorine containing polymer layers located on the sides of the defined metal structures, using a two step passivation procedure, comprising the steps of providing said defined metal structures, underlying said masking photoresist shape, with said chlorine containing polymer layers located on the sides of said defined metal structures;

performing a first passivation step of said two step passivation procedure, in an oxygen-water ambient, performed at a low, first temperature, below 140° C., to remove chlorine from said chlorine containing polymer layers that reside on the sides of a first set of metal structures, wherein said first set of metal structures are located near an edge of a semiconductor substrate, with said first passivation step of said two step passivation procedure not completely removing chlorine from chlorine containing polymer layers located on the sides of a second set of metal structures, located near a center of said semiconductor substrate;

performing a second passivation step of said two step passivation procedure, in a water only ambient to completely remove chlorine from said chlorine containing polymer layers that reside on the sides of said second set of metal structures, with said second passivation step performed at a higher temperature than said first passivation step, between about 200 to 250° C.;

removing said masking photoresist shape from top surface of said first set of metal structures, and from top surface of said second set of metal structures; and removing polymer layers from the sides of said first set of metal structures, and from the sides of said second set of metal structures.

14. The method of claim 13, wherein said defined metal structure is comprised of aluminum, aluminum-copper, aluminum-copper-silicon, or tungsten, at a thickness between about 5000 to 8000 Angstroms.

15. The method of claim 13, wherein said defined metal structure is formed using an anisotropic RIE procedure using chlorine or chlorine and $BCl_3$ as an etchant.

16. The method of claim 13, wherein said masking photoresist shape is comprised with a width between about 4000 to 10000 Angstroms, and with a thickness between about 16000 to 18000 Angstroms.

17. The method of claim 13, wherein said first passivation step, of said two step passivation procedure, is performed in an RF plasma tool, at an RF power between about 150 to 250 watts, and with said semiconductor substrate at said low first temperature, between about 100 to 140° C.

18. The method of claim 13, wherein said first passivation step, of said two step passivation procedure is performed using oxygen at a flow between about 750–850 sccm, and water at a flow between about 350 to 450 sccm.

19. The method of claim 13, wherein said first passivation step, of said two step passivation procedure is performed for a time between about 15 to 25 sec, at a pressure between about 4000 to 6000 mTorr.

20. The method of claim 13, wherein said second passivation step, of said two step passivation procedure is performed in an RF plasma tool, at an RF power between about 600 to 800 watts, and with said semiconductor substrate at said second temperature, between about 200 to 250° C.

21. The method of claim 13, wherein said second passivation step, of said two step passivation procedure, is performed using water only, at a flow between about 450–550 sccm.

* * * * *